(12) United States Patent
Kim

(10) Patent No.: US 7,786,529 B2
(45) Date of Patent: Aug. 31, 2010

(54) SEMICONDUCTOR DEVICE AND METHOD OF FABRICATING THE SAME

(75) Inventor: Dae Sik Kim, Icheon-si (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 220 days.

(21) Appl. No.: 11/943,791

(22) Filed: Nov. 21, 2007

(65) Prior Publication Data

US 2009/0001456 A1 Jan. 1, 2009

(30) Foreign Application Priority Data

Jun. 28, 2007 (KR) ............... 10-2007-0064473

(51) Int. Cl.
*H01L 29/772* (2006.01)

(52) U.S. Cl. ............... 257/330; 257/E29.112; 257/E29.119; 257/E29.121; 257/E29.122; 438/270

(58) Field of Classification Search .......... 257/330, 257/331, 343, E29.112, E29.119, E29.121, 257/E29.122; 438/270
See application file for complete search history.

(56) References Cited

U.S. PATENT DOCUMENTS 5,932,911 A * 8/1999 Yue et al. ............... 257/330
6,888,182 B2 * 5/2005 Mitani et al. ............ 257/241

FOREIGN PATENT DOCUMENTS

CN 1794467 A 6/2006
KR 10-2005-0045715 5/2005

OTHER PUBLICATIONS

Chinese Office Action dated Jan. 15, 2010 for Chinese patent application No. 200810089862.0, where the attached references were cited.
Korean Office Action dated Nov. 25, 2008, for Korean application No. 10-2007-0064473.

* cited by examiner

*Primary Examiner*—Matthew E Warren
*Assistant Examiner*—John Lin
(74) *Attorney, Agent, or Firm*—Lowe Hauptman Ham & Berner LLP

(57) ABSTRACT

A semiconductor device includes a transistor having a recessed gate, contact plugs formed in a region of a plurality of trenches, which are formed by recessing a semiconductor substrate. Further, a metal line and a source/drain region can be connected through the contact plug, so that on-current can be increased as much as an increased channel area.

4 Claims, 5 Drawing Sheets

SEMICONDUCTOR DEVICE AND METHOD OF FABRICATING THE SAME

CROSS-REFERENCES TO RELATED APPLICATIONS

The present application claims priority to Korean patent application number 10-2007-64473, filed on Jun. 28, 2007, which is incorporated by reference in its entirety.

FIELD OF THE INVENTION

The present invention relates to semiconductor devices and a method of fabricating the same and, more particularly, to a semiconductor device including a transistor having a recessed gate and a method of fabricating the same.

BACKGROUND OF THE INVENTION

As the design rule of metal oxide semiconductor field effect transistor (MOSFET) devices that have recently been developed reduces to sub-100 nm or less, a channel length accordingly is also decreased. As a result, in implementing a threshold voltage (Vt) target of a MOSFET device required in a specific device, an existing planar transistor structure is limited in terms of process and device. Thus, in order to prevent the short channel effect of the MOSFET device, active research has been done on a MOSFET device having a three-dimensional recessed gate in which the gate is formed in a groove formed by etching a silicon substrate.

However, the conventional three-dimensional recessed gate structure is problematic in that there is no increased on-current effect relative to an increased channel area, considering the channel area is increased.

SUMMARY OF THE INVENTION

The present invention is directed to a semiconductor device and a method of fabricating the same, in which on-current effect relative to an increased channel area can be improved in a semiconductor device including a transistor having a recessed gate.

In one embodiment of the present invention, a semiconductor device includes a plurality of trenches formed in parallel in an active region of a semiconductor substrate in one direction, a recessed gate formed to cross the trenches on the semiconductor substrate including the trenches, a source/drain region formed in the semiconductor substrate including the trenches on both sides of the recessed gate, an interlayer insulating layer formed over the semiconductor substrate including the recessed gate, contact plugs connected to the source/drain region of a trench bottom through first contact holes within the interlayer insulating layer and connected to the source/drain region within the semiconductor substrate through second contact holes between the first contact holes, and a metal line connected to the contact plugs. The first contact holes and the second contact holes are interconnected to form the contact plugs as a line pattern shape.

In another embodiment, a semiconductor device includes a plurality of trenches formed in parallel in an active region of a semiconductor substrate in one direction, a recessed gate formed to cross the trenches on the semiconductor substrate including the trenches, a source/drain region formed in the semiconductor substrate including the trenches on both sides of the recessed gate, a first interlayer insulating layer formed over the semiconductor substrate including the recessed gate, landing contact plugs connected to the source/drain region of a trench bottom through first contact holes within the first interlayer insulating layer, a second interlayer insulating layer formed on the first interlayer insulating layer including the landing contact plugs, metal line contact plugs connected to the landing contact plugs through second contact holes within the second interlayer insulating layer and connected to the source/drain region within the semiconductor substrate through third contact holes between the landing contact plugs, and a metal line connected to the metal line contact plugs. The second contact holes and the third contact holes are interconnected to form the metal line contact plugs as a line pattern shape.

In another embodiment of the present invention, a method of fabricating a semiconductor device includes forming a plurality of trenches in an active region of a semiconductor substrate in one direction, forming a recessed gate to cross the trenches on the semiconductor substrate including the trenches, forming a source/drain region in the semiconductor substrate including the trenches on both sides of the recessed gate, forming an interlayer insulating layer over the semiconductor substrate including the recessed gate, etching the interlayer insulating layer to form contact holes through which the source/drain region of a trench bottom and the source/drain region within the semiconductor substrate are exposed on both sides of the recessed gate, forming contact plugs to fill the contact holes, and forming a metal line, connected to the contact plugs, in parallel to the recessed gate.

The contact holes are divided into first contact holes through which the source/drain region of the trench bottom is exposed and second contact holes through which the source/drain region within the semiconductor substrate is exposed. The first contact holes and the second contact holes are interconnected to form the contact plugs in a line pattern.

In another embodiment of the present invention, a method of fabricating a semiconductor device includes forming a plurality of trenches in an active region of a semiconductor substrate in one direction, forming a recessed gate to cross the trenches on the semiconductor substrate including the trenches, forming a source/drain region in the semiconductor substrate including the trenches on both sides of the recessed gate, forming a first interlayer insulating layer over the semiconductor substrate including the recessed gate, etching the first interlayer insulating layer to form first contact holes through which the source/drain region of a trench bottom is exposed on both sides of the recessed gate, forming landing contact plugs to fill the first contact holes, forming a second interlayer insulating layer over the semiconductor substrate including the landing contact plugs, etching the second interlayer insulating layer to form second contact holes through which the landing contact plugs and the source/drain region within the semiconductor substrate are exposed, forming metal line contact plugs to fill the second contact holes, and forming a metal line, connected to the metal line contact plugs, in parallel to the recessed gate.

The second contact holes are divided into third contact holes through which the landing contact plugs are exposed and fourth contact holes through which the source/drain region within the semiconductor substrate is exposed.

In the above-mentioned embodiments, the source/drain region is formed by ion implanting an N+ impurity at a tilt angle of 0° to 20° and a twist angle of 30° to 40°. The source/drain region is formed by ion implanting an N+ impurity at a dose of 1.0E15 to 9.0E20 ions/cm$^2$ and ion implantation energy of 10 to 20 KeV.

The source/drain region is formed by ion implanting a P+ impurity at a tilt angle of 0 to 20° and a twist angle of 30° to 40°. The source/drain region is formed by ion implanting a P+ impurity at a dose of 1.0E15 to 9.0E20 ions/cm² and ion implantation energy of 10 to 20 KeV.

DESCRIPTION OF SPECIFIC EMBODIMENTS

Now, specific embodiments according to the present invention will be described with reference to the accompanying drawings.

Figure 1:
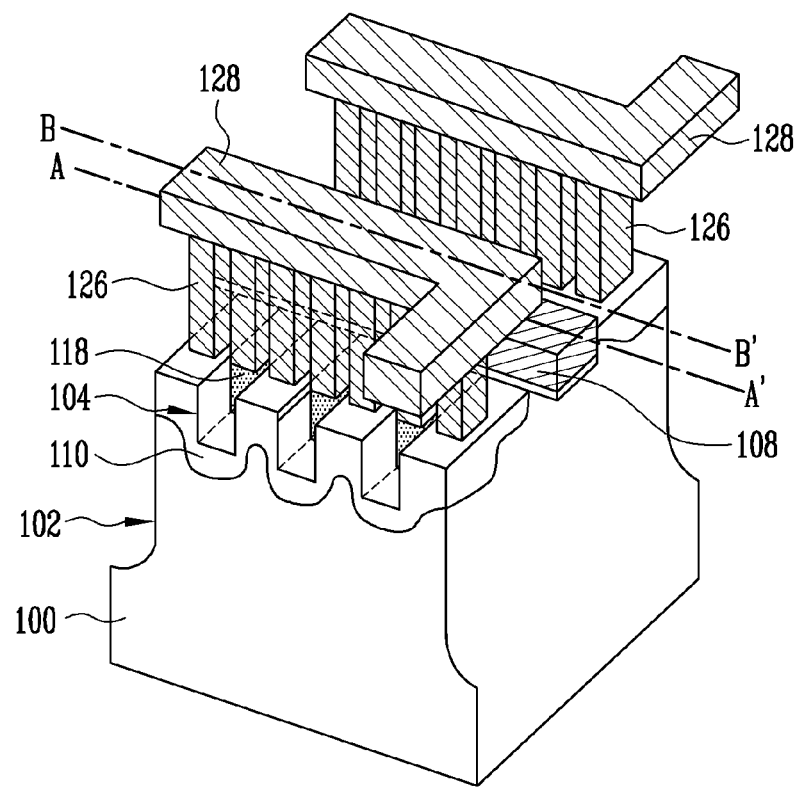
FIG. 1 is a perspective view of a semiconductor device including a transistor having a recessed gate according to an embodiment of the present invention.
Figure 2A:
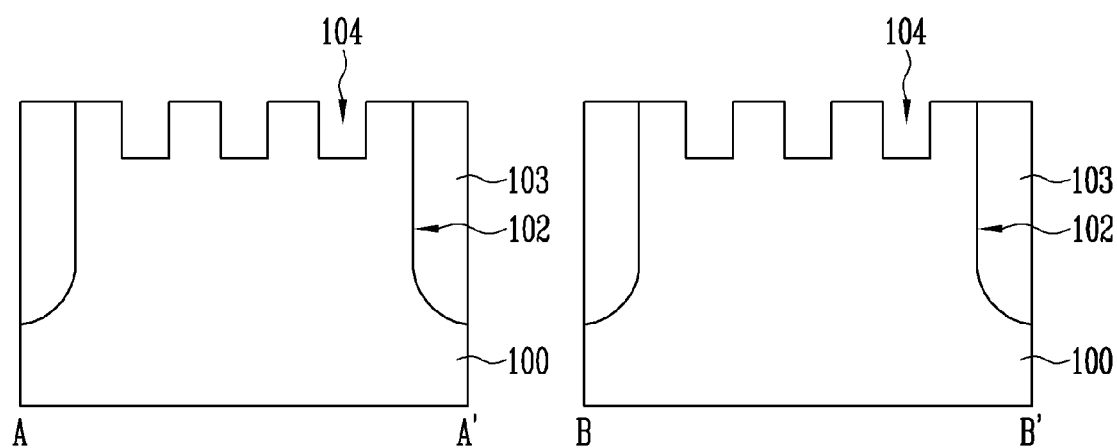
FIGS. 2A to 2I are cross-sectional views sequentially illustrating a process of fabricating the semiconductor device taken along lines A-A' and B-B' of FIG. 1.

Referring to FIG. 2A, a pad oxide layer (not shown) and a pad nitride layer (not shown) are sequentially formed over a semiconductor substrate 100 including a peripheral region. A photoresist pattern (not shown) through which the pad nitride layer of an isolation region is exposed is formed on the pad nitride layer. The pad nitride layer, the pad oxide layer, and the semiconductor substrate 100 of the isolation region are sequentially patterned by means of an etch process using the photoresist pattern as a mask, forming a first trench 102. The photoresist pattern is then removed.

An insulating material is deposited over the semiconductor substrate 100 including the first trench 102 and the patterned pad nitride layer, forming an insulating layer (not shown) to fill the first trench 102. The insulating layer is etched until the pad nitride layer is exposed. At this time, the insulating layer etch process may be performed by using a polishing process, such as a chemical mechanical polishing (CMP) process or a blanket etch process. Thus, the insulating layer remains only within the first trench 102, so that an isolation layer 103 is formed in the isolation region of the semiconductor substrate 100. At this time, an active region and the isolation region are defined by the isolation layer 103. Thereafter, the patterned pad nitride layer and the patterned pad oxide layer are sequentially removed.

An oxide layer (not shown) and a polysilicon layer (not shown) to be used as etch barriers are sequentially formed over the semiconductor substrate 100 including the isolation layer 103. A photoresist (not shown) is formed on the polysilicon layer and patterned to expose the semiconductor substrate 100 of the active region where a recessed gate will be formed. The polysilicon layer and the oxide layer are patterned by means of an etch process using the photoresist pattern as a mask. The semiconductor substrate 100 between the patterned polysilicon layer and the patterned oxide layer is recessed to form a plurality of second trenches 104 parallel to the active region of the semiconductor substrate 100 in one direction. The dimension of the second trenches 104 may be decided depending on a channel width. For example, in the event that a transistor having a channel width of 0.972 μm is formed, each of the depth and width of each second trench 104 can be set to 500 angstrom. Further, a top corner of the second trenches 104 can be formed as round as possible in order to mitigate the intensity of magnetic field. The photoresist pattern, the patterned polysilicon layer, and the oxide layer are removed thereafter.

Figure 2B:
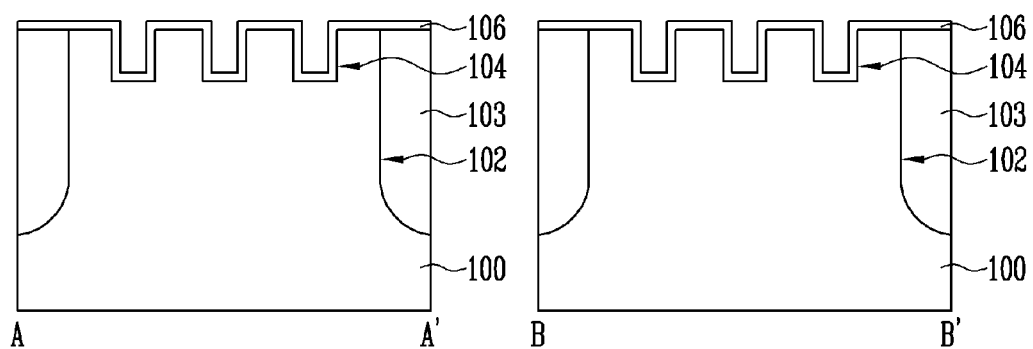

Referring to FIG. 2B, a gate insulating layer 106 is formed over the semiconductor substrate 100 including the plurality of second trenches 104 and the isolation layer 103. The gate insulating layer 106 may be formed of silicon oxide ($SiO_2$) by means of an oxidation process.

Figure 2C:
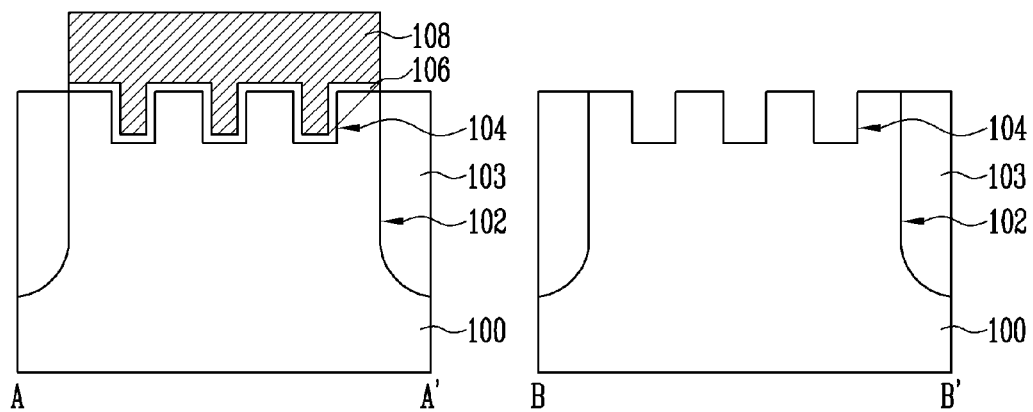

Referring to FIG. 2C, a conductive layer (not shown) and a hard mask are formed over the gate insulating layer 106, including the second trenches 104, in such a way to fill the plurality of second trenches 104. A photoresist (not shown) is formed on the hard mask and patterned to expose the hard mask of a region where the recessed gate will not be formed. The photoresist pattern is formed to cross the plurality of second trenches 104 parallel to each other in one direction. Meanwhile, the conductive layer can have a stack layer of a polysilicon layer or a polysilicon layer and a tungsten silicide ($WSi_x$) layer.

The hard mask, the conductive layer, and the gate insulating layer 106 are patterned by means of an etch process using the photoresist pattern as a mask. Thus, a recessed gate 108, which intersects the plurality of second trenches 104, is formed over the semiconductor substrate 100 including the second trenches 104. As described above, the recessed gate 108 has a three-dimensional structure while partially filling the plurality of second trenches 104 as much as the patterned portion, so that an area is increased as much as an area where the second trenches 104 are formed. Accordingly, when a source/drain region is formed in a subsequent process, the channel area can be increased as much as the increased area of the recessed gate 108. The photoresist pattern is then removed.

Though not shown in the drawings, after the insulating layer is formed over the semiconductor substrate 100 including the recessed gate 108, a spacer etch process may be performed to form spacers (not shown) on both sidewalls of the recessed gate 108.

Figure 2D:
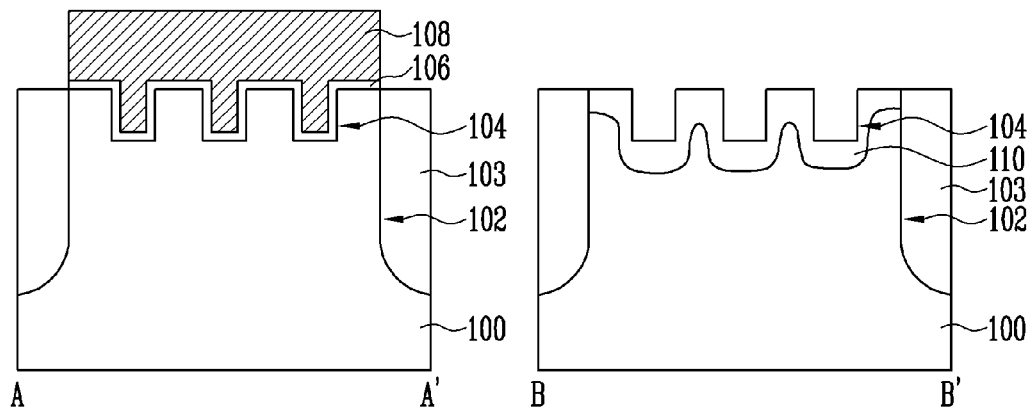

Referring to FIG. 2D, an ion implantation process is performed to form a source/drain region 110 in the semiconductor substrate 100 on both sides of the recessed gate 108 and the sidewalls and bottoms of the second trenches 104. At this time, as the area of the source/drain region 110 is increased due to the increased area of the three-dimensional recessed gate 108, the channel area is also increased.

In particular, the ion implantation process can be performed under a condition where an N+ impurity such as arsenic (As) is set to the dose of 1.0E15 to 9.0E20 ions/cm², ion implantation energy is set to 10 to 20 KeV, a tilt angle is set to 0° to 20°, and a twist angle is set to 300 to 400, or a P+ impurity such as $BF_2$ is set to the dose of 1.0E15 to 9.0E20 ions/cm², ion implantation energy is set to 10 to 20 KeV, a tilt angle is set to 0° to 20°, and a twist angle is set to 30° to 40° in order to lower resistance at the interface of landing contact plugs and metal line contact plugs formed in a subsequent process. A transistor of the MOSFET structure, including the gate insulating layer 106, the recessed gate 108, and the source/drain region 110, is thereby completed.

Figure 2E:
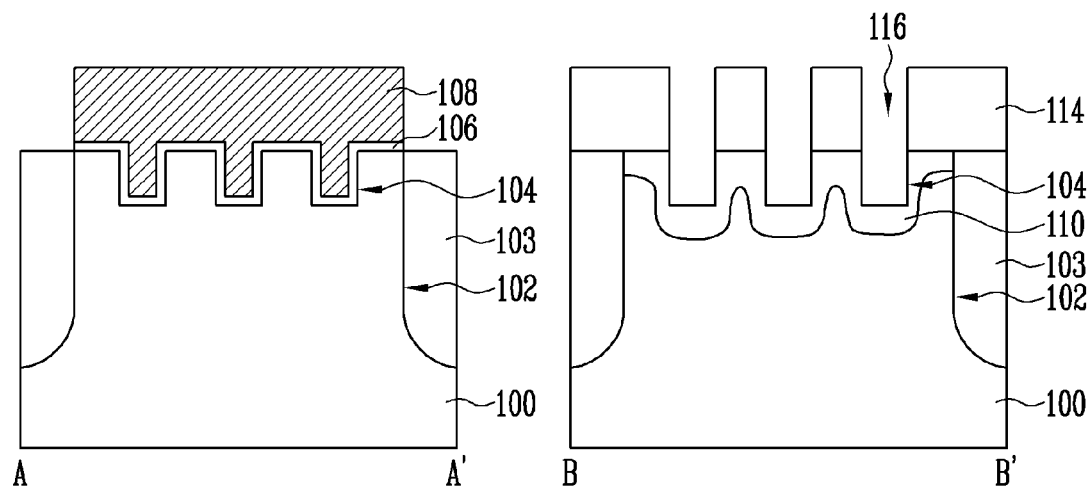

Referring to FIG. 2E, an insulating material is deposited over the semiconductor substrate 100 including the recessed gate 108, forming a first interlayer insulating layer 114. An etch process of the first interlayer insulating layer 114 is performed until the surface of the hard mask (not shown) formed on the recessed gate 108 is exposed. At this time, the first interlayer insulating layer 114 can be formed from any kind of insulating material, such as silicon oxide ($SiO_2$), spin on glass (SOG), borophosphosilicate glass (BPSG), phospho silicate glass (PSG), undoped silicate glass (USG) and tetraethyl orthosilicate glass (TEOS). The etch process of the first interlayer insulating layer 114 may be performed by using a polishing process such as a chemical mechanical polishing (CMP) process or a blanket etch process.

A photoresist (not shown) is formed on the first interlayer insulating layer 114 and the recessed gate 108 and patterned to expose the first interlayer insulating layer 114 corresponding to the second trenches 104. The photoresist pattern is formed to expose the first interlayer insulating layer 114 corresponding to the second trenches 104 on both sides of the recessed gate 108 in parallel to the recessed gate 108.

The first interlayer insulating layer 114 corresponding to the second trenches 104 on both sides of the recessed gate 108 is etched by means of an etch process using the photoresist pattern as a mask, forming a plurality of first contact holes 116 through which the semiconductor substrate 100 at the bottoms of the second trenches 104 is exposed.

Figure 2F:
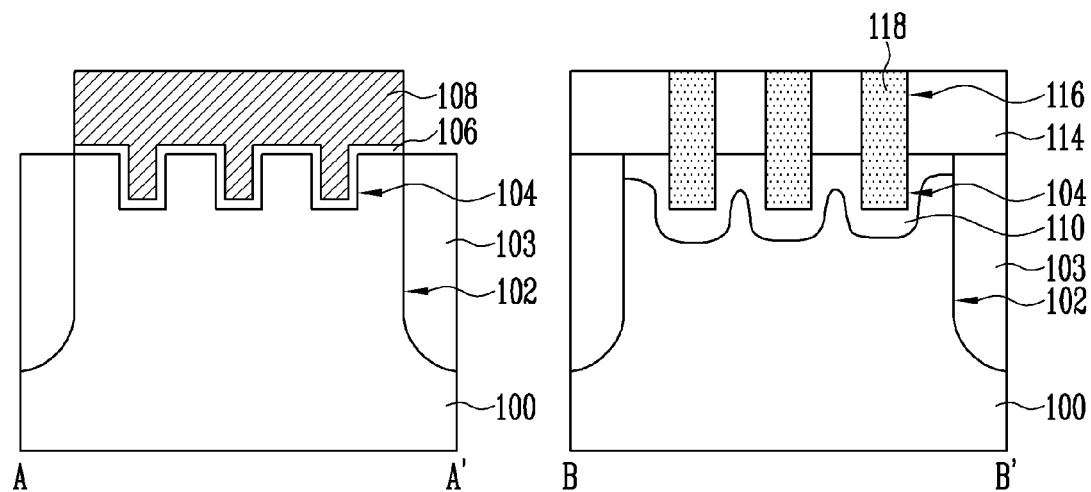

Referring to FIG. 2F, a conductive material is deposited on the first interlayer insulating layer 114, including the first contact holes 116, in such a way to fill the first contact holes 116, forming a conductive layer (not shown). The conductive layer is etched until the first interlayer insulating layer 114 is exposed. The conductive layer may be formed from a polysilicon layer. The etch process of the first interlayer insulating layer 114 may be performed by using a polishing process such as a CMP process or a blanket etch process. Consequently, the conductive layer remains only within the plurality of first contact holes 116, forming the landing contact plugs contact 118.

Figure 2G:
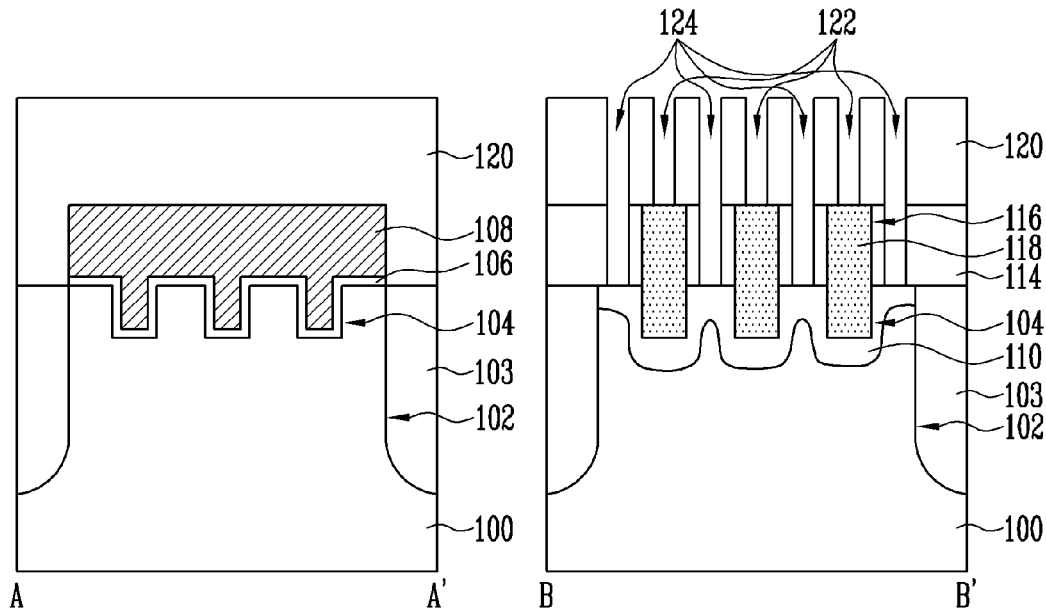

Referring to FIG. 2G, an insulating material is deposited on the first interlayer insulating layer 114 including the landing contact plugs 118, forming a second interlayer insulating layer 120. The second interlayer insulating layer 120 may be formed by using any kind of insulating material, such as $SiO_2$, SOG, BPSG, PSG, USG or TEOS. Meanwhile, after the second interlayer insulating layer 120 is formed, a process of polishing the top surface of the second interlayer insulating layer 120 may be further carried out.

A photoresist pattern (not shown), which exposes the second interlayer insulating layer 120 between the landing contact plugs 118 while exposing the second interlayer insulating layer 120 corresponding to the landing contact plugs 118, is formed on the second interlayer insulating layer 120. Second contact holes 122 through which the surface of the landing contact plugs 118 is exposed are formed by an etch process using the photoresist pattern as a mask. Third contact holes 124 through which the source/drain region 110 within the semiconductor substrate 100 is exposed are alternately formed between the second contact holes 122. The second and third contact holes 122 and 124 formed in the peripheral region are formed simultaneously with the formation of the bit line contact holes of a cell region.

Figure 3:
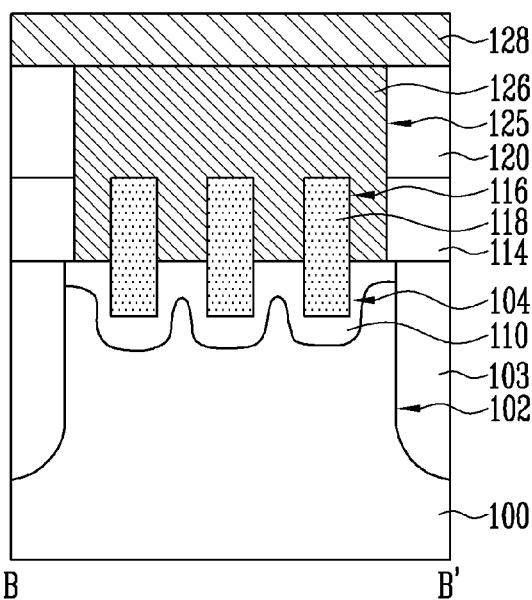
FIG. 3 is a cross-sectional view of a semiconductor device according to another embodiment of the present invention.

Meanwhile, in the embodiment of the present invention, it has been described above that the second contact holes 122 and the third contact holes 124 have the hole pattern shape and are alternately formed in parallel to the recessed gate 108. However, in an alternative embodiment, the second contact holes 122 and the third contact holes 124 of FIG. 2G can be interconnected to form a contact hole 125 having a line pattern shape parallel to the recessed gate 108, as shown in FIG. 3. In this case, metal line contact plugs to be formed subsequently can also be formed to have a line pattern. The photoresist pattern is then removed.

Figure 2H:
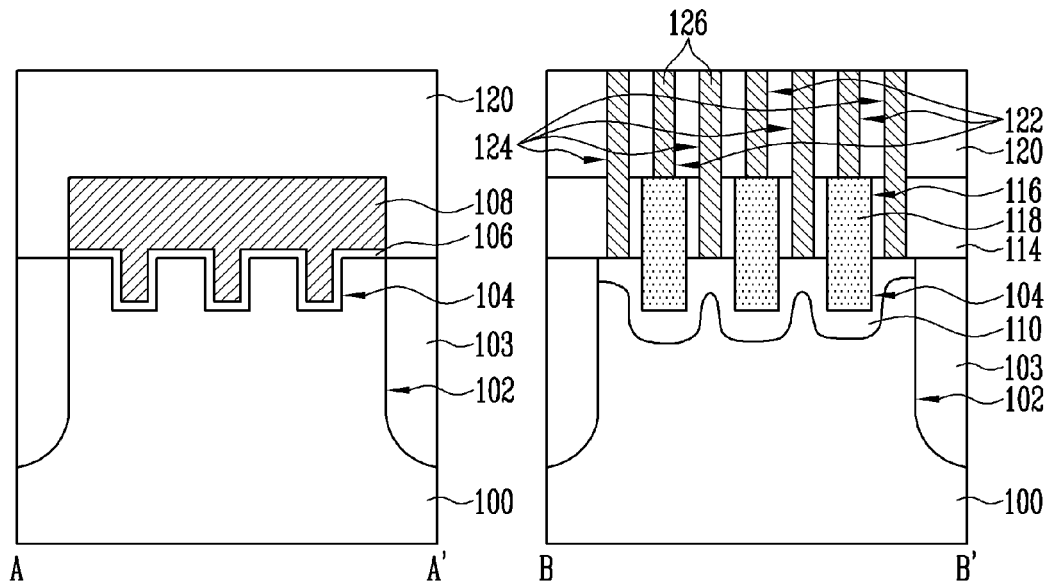

Referring to FIG. 2H, a conductive material is deposited on the second interlayer insulating layer 120 in such a way to fill the second and third contact holes 122 and 124, forming a conductive layer (not shown). The conductive layer is etched until the surface of the second interlayer insulating layer 120 is exposed. At this time, the conductive layer may be formed from a polysilicon layer. The etch process of the second interlayer insulating layer 120 may be formed by using a polishing process such as a CMP process or a blanket etch process.

Consequently, the conductive layer remains only within the second contact holes 122 and the third contact holes 124, so that the metal line contact plugs 126 are formed. The metal line contact plugs 126 are formed in the cell region simultaneously with the formation of the bit line contact plugs.

Figure 2I:
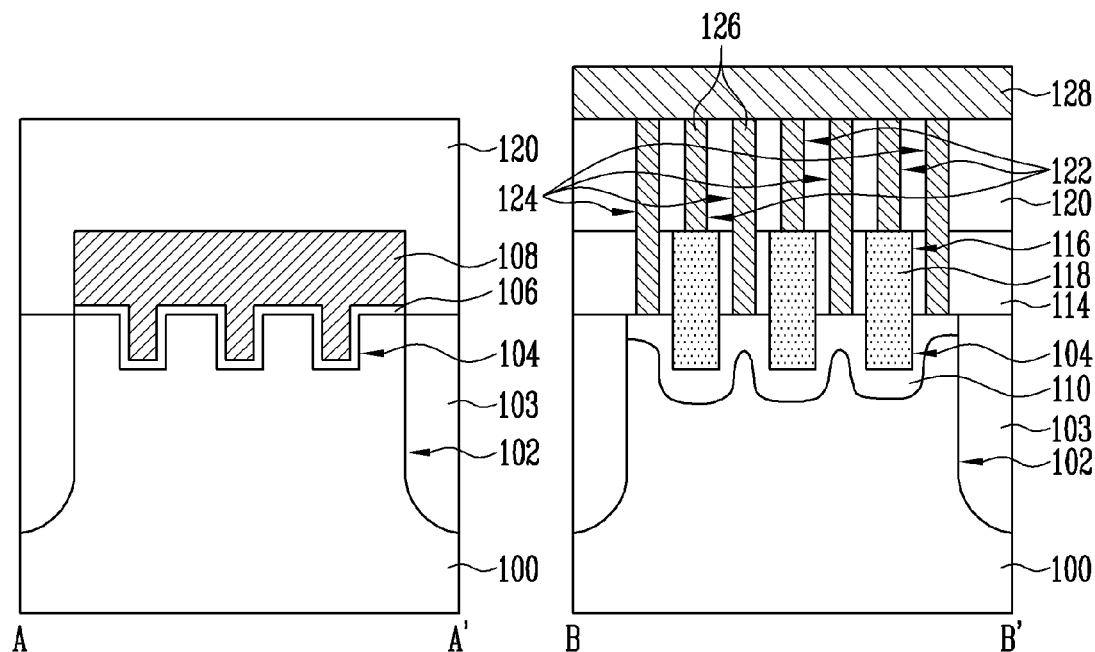

Referring to FIG. 2I, a conductive material is deposited on the second interlayer insulating layer 120 including the metal line contact plugs 126, forming a conductive layer (not shown). A photoresist (not shown) is formed on the conductive layer and patterned to expose the conductive layer other than regions corresponding to the metal line contact plugs 126. The conductive layer can be formed from material having a low resistance, such as tungsten (W), titanium (Ti), titanium nitride (TiN), aluminum (Al) or aluminum (Al) alloy.

The conductive layer is patterned by an etch process using the photoresist pattern as a mask, forming a metal line 128 connected to the metal line contact plugs 126. At this time, the metal line 128 is formed in parallel to the recessed gate 108 on both sides of the recessed gate 108. The photoresist pattern is then removed.

As described above, in the embodiment of the present invention, the landing contact plugs 118, which were formed only in the existing cell region, are expanded up to the peripheral region and then formed within the plurality of second trenches 104 formed by recessing the semiconductor substrate 100. The metal line contact plugs 126 are then formed on the landing contact plugs 118. Accordingly, the source/drain region 110 and the metal line 128 are formed even in the region where the second trenches 104 are formed, so that on-current can be increased as much as an increased channel area through the formation of the three-dimensional recessed gate 108.

For convenience of description, in the embodiment of the present invention, it has been described that the landing contact plugs 118 are formed within the second trenches 104 and the metal line contact plugs 126 are then formed on the landing contact plugs 118 in order to connect the source/drain region 110 and the metal line 128. However, the landing contact plugs 118 may not be necessarily formed. In this case, when the metal line contact plugs 126 are formed, they can be expanded into the second trenches 104 to connect the source/drain region 110 and the metal line 128 through the metal line contact plugs 126. Even in this case, on-current can be increased as much as an increased channel area through the formation of the three-dimensional recessed gate 108.

In the case of DRAM, the landing contact plugs may be formed in the peripheral region by means of a process of forming the landing contact plugs in the cell region. A process of forming the landing contact plugs is known in the art and will be thus omitted.

In accordance with the present invention, in a semiconductor device including a transistor having a recessed gate, contact plugs are formed even in a region where a plurality of trenches, which are formed by recessing a semiconductor substrate, are formed. Accordingly, a metal line and a source/drain region can be connected through the contact plug, so that on-current can be increased as much as an increased channel area.

Although the foregoing description has been made with reference to the specific embodiments, it is to be understood that changes and modifications of the present invention may be made by the ordinary skilled in the art without departing from the spirit and scope of the present invention and appended claims.

What is claimed is:

1. A semiconductor device, comprising:
a plurality of trenches formed in parallel in an active region of a semiconductor substrate in one direction;
a recessed gate formed to cross and fill the trenches in the semiconductor substrate;
source/drain regions formed on an upper surface of the semiconductor substrate and in the bottom of the trenches on both sides of the recessed gate;
an interlayer insulating layer formed over the semiconductor substrate and the recessed gate;
contact plugs connected to the source/drain regions in the trench bottoms through first contact holes within the interlayer insulating layer and connected to the source/drain regions on the upper surface of the semiconductor substrate through second contact holes between the first contact holes; and
a metal line connected to the contact plugs.

2. The semiconductor device of claim 1, wherein the first contact holes and the second contact holes are interconnected to form the contact plugs as a line pattern shape.

3. A semiconductor device, comprising:
a plurality of trenches formed in parallel in an active region of a semiconductor substrate in one direction;
a recessed gate formed to cross and fill the trenches in the semiconductor substrate;
source/drain regions formed on an upper surface of the semiconductor substrate and in bottom of the trenches on both sides of the recessed gate;
a first interlayer insulating layer formed over the semiconductor substrate and the recessed gate;
landing contact plugs connected to the source/drain regions in the trench bottoms through first contact holes within the first interlayer insulating layer;
a second interlayer insulating layer formed on the first interlayer insulating layer and the landing contact plugs;
metal line contact plugs connected to the landing contact plugs through second contact holes within the second interlayer insulating layer and connected to the source/drain regions on the upper surface of the semiconductor substrate through third contact holes between the landing contact plugs; and
a metal line connected to the metal line contact plugs.

4. The semiconductor device of claim 3, wherein the second contact holes and the third contact holes are interconnected to form the metal line contact plugs as a line pattern shape.

* * * * *